United States Patent [19]
Liu

[11] Patent Number: 5,517,448
[45] Date of Patent: May 14, 1996

[54] BIAS CIRCUIT FOR VIRTUAL GROUND NON-VOLATILE MEMORY ARRAY WITH BANK SELECTOR

[75] Inventor: Ding-Jen Liu, Hsinchu, Taiwan

[73] Assignee: United Microelectronics Corp., Hsinchu, Taiwan

[21] Appl. No.: 303,679

[22] Filed: Sep. 9, 1994

[51] Int. Cl.$^6$ ............................................. G11C 11/34
[52] U.S. Cl. ........................... 365/185.11; 365/230.02; 365/230.03
[58] Field of Search ................ 365/189.09, 230.03, 365/230.02, 189.11, 185.11, 185.16, 185.18; 327/538, 539

[56] References Cited

U.S. PATENT DOCUMENTS 4,281,397  7/1981  Neal et al. ........................... 365/230.04
5,132,933  7/1992  Schreck et al. ...................... 365/230.06

Primary Examiner—A. Zarabian
Attorney, Agent, or Firm—Ladas & Parry

[57] ABSTRACT

A bias circuit for virtual ground non-volatile memory array with bank selector, utilizes static pull-up transistors connected respectively to all bit lines of the memory array. The gates of the static pull-up transistors are connected to a predetermined reference voltage for supplying a global bias voltage to the bit lines. Another predetermined reference voltage, acting as a local bias voltage, is supplied to a deselected virtual ground bit line which is adjacent to the selected data sense bit line. By these two bias techniques, the leakage current of the adjacent deselected "ON" memory cells is minimized; as a result, the stability of the current detector is largely enhanced; the probability of erroneous data reading is reduced; the operating voltage margin of the memory devices is enlarged; and the data accessing is expedited.

19 Claims, 4 Drawing Sheets

BIAS CIRCUIT FOR VIRTUAL GROUND NON-VOLATILE MEMORY ARRAY WITH BANK SELECTOR

BACKGROUND OF THE INVENTION

The present invention relates generally to a non-volatile memory array bias circuit, and more particularly to a bias circuit for virtual ground non-volatile memory array with bank selector.

Non-volatile memory products are very commonly adopted in computer and other electronic products. Non-volatile memory, products include Read Only Memories (ROMs), floating gate-type memories, and Electrically Programmable ROMs (EPROMs). In concert with the development of Very Large Scale Integration (VLSI) processing technology and the development of more and more sophisticated computer and other electronic technologies, the marketplace has placed more and more demands on non-volatile memory products to store more and more data. In order to store more data, smaller cell sizes and higher memory density is certainly the trend demanded by the marketplace. However, some processing factors affect the cell size such as: active pitch, metal line pitch, and contact pitch. Because of these factors, the conventional NOR plan memory cell can not satisfy the above requirements. In order to enhance memory density and to reduce cell size, there is another memory technology called "Flat-Cell Memory" which overcomes the limitations mentioned above, and therefore it has been widely adopted for high density non-volatile memory.

Referring now to FIGS. 1 and 2, FIG. 1 shows an example of a sub-array layout for a conventional flat-cell memory having bank selector; FIG. 2 shows the equivalent circuit schematic for the layout depicted in FIG. 1. For convenience, FIG. 1 only shows one memory bank BK-0; FIG. 2 shows the memory bank BK-0 and partial memory bank BK-1 without details. However, those skilled in the art should know that the structure of BK-1 is the same as BK-0. Also, it should be noted that in these diagrams memory cells are shown in the form of floating gate type Electrically Erasable Programmable ROM (EEPROM) cells; however, the cells could be of the ROM type instead of being of the EEPROM type. The flat-cell memory uses NOR-connected flat-cells to form a virtual ground architecture in order to reduce the size of the memory cell and thus to enhance the memory density. More specifically, the memory bank BK-0 includes a plurality of rows and columns of memory cells (K,0)~(K,7) . . . , (L,0)~(L,7) . . . ; word lines WL_K~WL_L; bank select lines SEL_OH and SEL_OL; and bank select transistors (or bank selectors) 121-0~121-8, 122-0~122-8. Each memory cell (K,0)~(K,7), (L,0)~(L,7) may be programmed to have a low threshold voltage(VT), called "on" cell, or programmed to have a high threshold voltage, called "off" cell. Bank selectors 121-0~121-8, 122-0~122-8 are all "on" transistors having low threshold voltage. Memory bank BK-1 has the same structure, and for example in a 32×32 memory sub-array, also includes a plurality of rows and columns of memory cells (0,0)~(0,31), . . . ,(31,0)~(31,31) (these reference numbers are not particularly indicated in the drawings); word lines WL_0~WL_31; bank select lines SEL_1H and SEL_1L. This structure uses buried $N^+$ diffusion regions to form local bit lines 123-0~123-8; and metal lines to form data sense bit lines SA-0123, SA-4567, and virtual ground bit lines VG-01, VG-2345, VG-67. Metal lines as shown in FIGS. 1 and 2 are laid out in a zigzag pattern, and the data sense bit lines and the virtual ground bit lines are alternately arranged. Through metal/diffusion contacts, the metal lines are connected to the bank selectors in the form of flat-cell and the buried $N^+$ local bit lines. At the time of accessing to a cell in flat-cell memory array with bank selectors, the corresponding word lines and bank select lines are activated; and the rest of word lines and bank select lines are deactivated. The signal path is from the corresponding data sense bit line to the buried $N^+$ local bit line, i.e. the drain of the selected cell, via the "on" bank select transistor. Then, the signal path is from the drain of the selected cell to the source of the selected cell, i.e. the other buried $N^+$ local bit line at the other side of the selected cell, via the selected cell itself. Finally, the signal path is connected to the virtual ground bit line via the other corresponding bank select transistor.

Reference is now made to FIG. 3 for the details of data access path of memory array. The memory array, similar to the one in FIG. 2, and its column multiplexer are shown here. The column multiplexer includes two stages, and the first stage column multiplexer 201 is used to select a data sense bit line, called the selected data sense bit line, for connecting to current detector. The first stage column multiplexer 201 is also used to select the two virtual ground bit lines adjacent to two sides of the selected data sense bit lines for connecting to the second stage column multiplexer 202. The first stage column multiplexer 201 is composed of transfer gates 111~116 which are controlled by the outputs of a column decoder (not shown). Each output line (YSEL) of the column decoder controls three transfer gates of the first stage column multiplexer for connecting the selected data sense bit lines and the two adjacent virtual ground bit lines to the peripheral circuits. The rest of data sense bit lines and virtual ground bit lines are isolated from the peripheral circuits, including the current detector and ground GND, by the turned-off transfer gates in the first stage column multiplexer 201. The second stage column multiplexer 202 is used to select one of the two virtual ground bit lines laterally adjacent to the selected data sense bit line for being grounded, and the other isolated from the ground. The virtual ground bit line which is connected to the ground via the transfer gates 101 and 104 of the second stage column multiplexer, is called the selected virtual ground bit line. The second stage column multiplexer 202 is also composed of transfer gates which are controlled by the outputs of another column decoder (not shown), or an address buffer. The first stage column multiplexer 201 is connected with the current detector via a signal line 250. The second stage column multiplexer 202 is coupled to the first stage column multiplexer 201, and is used to select one of the two virtual ground bit lines output from the first stage column multiplexer 201 for being connected to the ground.

When a cell within the memory array is selected to be accessed, all the corresponding word line, bank select line, and YSEL line are activated, and the rest of them are deactivated. There are four kinds of selected cell conditions which are described in detail hereinafter.

(1) If cell (K,3) is the selected cell, the word-line WL_K and bank select line SEL_OH are turned to a high logic level; at the same time, the control select lines YSEL-0123 and YA1 of the column multiplexers 201 and 202 are also turned to a high logic level; the rest of word lines, bank select lines, and column multiplexer's control select lines are turned to a low logic level. The signal path, starting from the data line 250, travels via the transfer gate 112 of the column multiplexer 201, to the data sense bit line SA-0123, which is called the selected data sense bit line, and then to the buried $N^+$ local bit line 123-3 via the bank selector 121-3, and then to the bank selector 121-4 via the selected cell (K,3), and to the virtual ground bit line VG-2345, which is called the selected virtual ground bit line, and finally via the transfer gate 113 in the column multiplexer 201 and the transfer gate 104 in the column multiplexer 202 to ground (GND) 314.

(2) If cell (K,2) is the selected cell, the word-line WL__K and bank select line SEL__OL are turned to a high logic level; at the same time, the control select lines YSEL-0123 and YA1 of the column multiplexers 201 and 202 are also turned to a high logic level; the rest of word lines, bank select lines, and column multiplexer's control select lines are turned to a low logic level. The signal path, starting from the data line 250, travels via the transfer gate 112 of the column multiplexer 201, to the data sense bit line SA-0123, which is called the selected data sense bit line, and then to the buried $N^+$ local bit line 123-2 via the bank selector 122-2, and then to the bank selector 122-3 via the selected cell (K,2), and to the virtual ground bit line VG-2345, which is called the selected virtual ground bit line, and finally via the transfer gate 113 in the column multiplexer 201 and the transfer gate 104 in the column multiplexer 202 to ground (GND) 314.

(3) If cell (K,1) is the selected cell, the word-line WL__K and bank select line SEL__OH are turned to a high logic level; at the same time, the control select lines YSEL-0123 and YA1B of the column multiplexers 201 and 202 are also turned to a high logic level; the rest of word lines, bank select lines, and column multiplexer's control select lines are turned to a low logic level. The signal path, starting from the data line 250, travels via the transfer gate 112 of the column multiplexer 201, to the data sense bit line SA-0123, which is called the selected data sense bit line, and then to the buried $N^+$ local bit line 123-2 via the bank selector 121-2, and then to the bank selector 121-1 via the selected cell (K,1) and the buried $N^+$ local bit line 123-1, and to the virtual ground bit line VG-01, which is called the selected virtual ground bit line, and finally via the transfer gate 111 in the column multiplexer 201 and the transfer gate 101 in the column multiplexer 202 to ground (GND) 314.

(4) If cell (K,0) is the selected cell, the word-line WL__K and bank select line SEL__OL are turned to a high logic level; at the same time, the control select lines YSEL-0123 and YA1B of the column multiplexers 201 and 202 are also turned to a high logic level; the rest of word lines, bank select lines, and column multiplexer's control select lines are turned to a low logic level. The signal path, starting from the data line 250, travels via the transfer gate 112 of the column multiplexer 201, to the data sense bit line SA-0123, which is called the selected data sense bit line, and then to the buried $N^+$ local bit line 123-1 via the bank selector 122-1, and then to the bank selector 122-0 via the selected cell (K,0) and the buried $N^+$ local bit line 123-0, and to the virtual ground bit line VG-01, which is called the selected virtual ground bit line, and finally via the transfer gate 111 in the column multiplexer 201 and the transfer gate 101 in the column multiplexer 202 to ground (GND) 314.

From above four exemplary selected cell signal paths, it is to be noted that the word lines are used to activate the memory cells, and the bank select lines are used to select the bank selectors for the signal path. For example, if the selected signal path is through the upper bank selectors of the memory bank BK-0, then bank select line SEL__OH is turned to a high logic level. The output control select line, YSEL, of the column decoder is used to determine which line is the selected data sense bit line, and which line is the selected virtual ground bit line, and to connect the selected data sense bit line to the current detector. The control select lines YA1 and YA1B are used to determine which one of the two virtual ground bit lines, laterally adjacent to the selected data sense bit line, is the selected virtual ground bit line, and the other is the deselected virtual ground bit line, and to connect the selected virtual ground bit line to the ground GND. From the foregoing analysis, the bank select line SEL__OH is used to select the bank selector for the cells (K,1), (K,3), . . . , and (K,2N+1), where N=0,1,2. . . , and the bank select line SEL__0L is used to select the bank selector for the cells (K,0), (K,2), . . . , and (K,2N). The control select line YSEL-0123 is used to select the selected data sense bit line for the four cells (K,0), (K,1), (K,2), and (K,3); similarly, the control select line YSEL-4567 is used to select the selected data sense bit line for the four cells (K,4), (K,5), (K,6), and (K,7); and the rest of the control select lines of the first stage column multiplexer 201 works in a similar fashion. The control select line YA1 is used to select the selected virtual ground bit line for the selected cells (K,2) and (K,3); or cells (K,6) and (K,7); . . . ; or cells (K,4N+2) and (K,4N+3). The control select line YA1B is used to select the selected virtual ground bit line for the selected cells (K,0) and (K,1); . . . ; or cells (K,4N+0) and (K,4N+1).

As shown in FIGS. 1 and 3, in the flat-cell memory array structure, when accessing data, all memory cells that are connected to the selected word line are activated. If the cells adjacent to both sides of the selected cell are "ON" cells, the current will flow into the selected cell via these adjacent cells, and vice versa. In this case, the current flowing through the selected cell is not equal to the current through the multiplexer, nor to the current through the current detector. In certain cases, if the difference between the current flowing through the current detector and the current through the selected cell is too large, and the current through the current detector is used to determine the selected storage data, detection errors or delays in detection of the data may be caused. Therefore, a biasing technique has to be utilized to avoid or reduce the current flowing from adjacent "ON" cells into the selected memory cell, or the current flowing from the selected memory cell into adjacent "ON" cells.

The U.S. Pat. No. 4,281,397 discloses a biasing technique, wherein each virtual ground bit line is connected to a diode-type pull-up NMOS transistor. The drains of the transistors are connected to the power source $V_{dd}$, and thus to charge the deselected virtual ground bit line to the level of $V_{dd}$-$V_{TH}$ ($V_{TH}$ is the threshold voltage of the transistors). Besides, the selected virtual ground bit line is pulled down to near the ground by the selected and grounded NMOS transistor, and thus the current leakage of adjacent "ON" cells is reduced. Precisely controlling voltage $V_{dd}$ can reduce the voltage difference between the deselected virtual ground bit line ($V_{dd}$-$V_{TH}$) and the selected data sense bit line, and the voltage potential at the drain of the adjacent "ON" cell is very close to the one at the source of the same cell; thus the current leakage of the adjacent "ON" memory cell is so small as to be negligible.

In fact, it is very difficult to obtain a very precise $V_{dd}$ value because $V_{dd}$ is generated by a bias circuit and is connected to the static pull-up NMOS transistors of all virtual ground bit lines in the chip. Furthermore, the voltage of the selected data sense bit line is limited by the voltage clamper in each I/O (input/output) current detector. The circuit layouts of these two circuits are far apart, and the circuit connections differ from each other; therefore, it is hard to achieve the process tracking and power noise tracking. If the voltage difference between the selected data sense bit line and the adjacent deselected virtual ground bit line exceeds 0.3 Volt, a noticeable current leakage in the adjacent "ON" cell will occur and this leads to a slow down in accessing data. Another problem is the strength of the static pull-up transistors. The pull-down voltage of the selected virtual ground bit line is influenced by the static pull-up NMOS transistor and the selected and grounded pull-down NMOS transistor. More specifically, if the static pull-up NMOS transistor is stronger, the pull-down voltage for the selected virtual ground bit line is higher; thus the current through the selected "ON" cell is smaller, and the access time is longer. On the other hand, if the static pull-up transistor is weaker, and when the selected bit lines are altered to access another cell, the deselected virtual ground bit line which is the previous selected virtual ground bit line and is now adjacent to the new selected cell will be charged from original ground voltage (e.g. about 0.2 V) to the voltage $V_{dd}$-$V_{TH}$. However, this deselected virtual ground bit line is very hard to be charged to the voltage $V_{dd}$-$V_{TH}$ within one reading cycle due to the weak static pull-up NMOS transistor. Consequently, between the source and the drain of the adjacent "ON" cell there exists a large potential difference which induces a large current leakage through this cell and therefore significantly affects the data access time.

U.S. Pat. No. 5,132,933 discloses another biasing technique which utilizes the sense amplifier bias circuit in the current detector to generate a first predetermined bias voltage for connecting to the selected data sense bit line, and also utilizes another sense amplifier bias circuit to generate a second predetermined bias voltage, which approximately equals the first predetermined bias voltage, for connecting to the deselected virtual ground bit line adjacent to the selected data sense bit line. This makes the drain and the source voltages of the cell adjacent to the selected cell equal, and thus largely reduces current leakage of the adjacent "ON" cell. The rest deselected virtual ground bit lines are connected to a reference potential, i.e. virtual ground potential (normally $V_{ss}$), so as to provide the memory array with a discharge path to avoid the charge trapping of virtual ground bit line due to power noise.

However the biasing technique disclosed by the U.S. Pat. No. 5,132,933 is only suitable for a virtual ground memory array without bank selectors. For those memory arrays with bank selectors, this technique will still result in a large current leakage in adjacent "ON" cell. The reason is as follows:

Referring to FIG. 2 or FIG. 3, assume cell (K,1) is the selected cell and is programmed as an "OFF" cell. Also assume that cells (K,2), (K,3), (K,4), (K,5), and (K,6) are programmed as "ON" cells. The selected virtual ground bit line is VG-01; the selected data sense bit line is SA-0123; the deselected virtual ground bit line adjacent to the selected data sense bit line is VG-2345, and the deselected data sense bit line most close to the selected data sense bit line is SA-4567. In this patent, the selected virtual ground bit line VG-01 is pulled down to a virtual ground, the selected data sense bit line SA-0123 is connected to the first predetermined bias voltage, and the deselected virtual ground bit line VG-2345 is connected to the second predetermined bias voltage. Thus the voltage of VG-2345 and the voltage of SA-0123 are very close. However, since the deselected data sense bit line SA-4567 is pulled down to virtual ground (or to a reference voltage), there is a large current (about the same as "ON" cell current) flowing from the deselected virtual ground bit line VG-2345 to the deselected data sense bit line SA-4567. More specifically, this current flows through the network formed by the bank selectors 121-4, 121-5 and cell (K,4), and then through cell (K,5), and finally through the network formed by the bank selectors 121-6, 121-7 and cell (K,6), to the virtual ground of the deselected data sense bit line SA-4567. Since the impedances of the bank selectors and the memory cells approximately equal, this current makes the voltage of the buried $N^+$ local bit line 123-4 drops to the potential lower than the virtual ground bit line VG-2345, so that a large potential difference exists between the source and the drain of cell (K,3), and this, in turn, induces a current flowing through the cell (K,3). This current flows from the current detector through the data sense bit line SA-0123 and the circuit formed by the bank selectors 121-2, 121-3 and cell (K,2), and then through cell (K,3); consequently, the current detector will detect a large current that causes the error reading on the selected "OFF" cell (K,1). This situation will be improved and the correct data will be detected until the leakage current has charged up the data sense bit line SA-4567 to the potential close to the potential of the data sense bit line SA-0123. Only when this happens, the leakage current decreases to a negligible level, so that the correct data is sensed. However, since the data sense bit lines have large capacitance, about 4–8 pf, the charging time of the data sense bit line SA-4567 is very long, and so is the data access time. This degrades the operating speed of the memory device. In conclusion, the biasing technique of this patent pulls down all the deselected data sense bit lines and all the deselected virtual ground bit lines except the one adjacent to the selected cell to virtual ground. Because of the existence of the bank selectors, there is a large induced potential drop between the two buried $N^+$ local bit lines, all located laterally adjacent to one side of the selected cell which is opposite to the other side of the selected cell to which the selected virtual ground bit line is adjacent. This potential drop induces the current leakage in adjacent "ON" cell, and thus causes the error or delay in data accessing. Therefore, this biasing technique is not suitable for the flat-cell memory array with bank selector.

SUMMARY OF THE INVENTION

Therefore, it is an object of the present invention to provide a bias circuit for virtual ground non-volatile memory array with bank selector, which can significantly reduce the leakage current of adjacent "ON" cells so as to rapidly and correctly sense the programmed data of the selected cell.

According to the present invention, the bias circuit for virtual ground non-volatile memory array with bank selector comprises three major parts:

(1) Local bias circuitry: used to provide a more precise and more easily controllable bias voltage for the selected data sense bit line, the selected virtual ground bit line adjacent to the selected data sense bit line, and the selected local isolation bit line;

(2) Improved column multiplexer: selects corresponding virtual ground bit line, data sense bit line, and local isolation bit line for connecting to the local bias circuitry, according to the decoded signal from the column decoder; and (3) Global bias circuitry: used to generate a rough bias voltage for all bit lines. According to the present invention, since this bias voltage is unnecessary to be very precise, the requirements for process tracking and power noise tracking are not very strict. Furthermore, the static pull-up devices in the global bias circuitry of the present invention are only used for maintaining the voltage of the deselected bit lines in order to compensate for the leakage current of the deselected bit lines, and therefore there is no other limitation except the requirement of weak strength for the static pull-up devices.

According to one preferred embodiment of the present invention, the local bias circuitry includes three parts:

(1) CURRENT DETECTOR: used to detect the current of the selected cell. The current detector is connected to the selected data sense bit line through the improved column multiplexer, and clamps the voltage of the selected data sense bit line approximately at a first reference voltage which is the trip voltage of an inverting device in the current detector.

(2) LOCAL BIAS DRIVER: its structure is similar to that of the current detector, and through an inverting device therein, it supplies a second reference voltage which is the trip voltage of the inverting device. Via the column multiplexer, the local bias driver is connected to the deselected virtual ground bit line adjacent to the selected data sense bit line. In this specification, this deselected virtual ground bit line is called the selected local isolation bit line. The local bias driver provides a bias voltage to the selected local isolation bit line in order to reduce the potential difference between the two buried $N^+$ local bit lines, all located laterally adjacent to one side of the selected cell which is opposite to the other side of the selected cell to which the selected virtual ground bit line is adjacent, to minimum. In other words, the potential difference between the source and the drain of adjacent "ON" cell is reduced to minimum so that the leakage current in "ON" cell is diminished. The local bias driver also includes a bleed device connected to the selected local isolation bit line through the column multiplexer. The bleed device is used to provide a discharge path for the trapped charges in the virtual ground bit line rendered by the power noise, and thus to stabilize the second reference voltage.

(3) VIRTUAL GROUND REFERENCE NODE: provides a virtual ground reference voltage (normally ground), and connects to the selected virtual ground bit line via the column multiplexer so as to provide the ground for the current path of the selected cell.

According to one preferred embodiment of the present invention, the improved column multiplexer is composed of a set of transfer gates which are controlled by the outputs from the column decoder in order to select the proper bit lines to connect to the local bias circuitry. More specifically, the improved column multiplexer is used to connect the selected data sense bit line with the current detector, to connect the selected virtual ground bit line with the virtual ground reference node, and to connect the selected local isolation bit line with the local bias driver. Besides the above three bit lines, other deselected bit lines are isolated from the local bias circuitry (including the current detector, local bias driver, and virtual ground reference node) by the turned-off transfer gates of the improved column multiplexer.

According to one preferred embodiment of the present invention, the global bias circuitry is used to provide a third bias voltage, which approximately equals the second reference voltage in the local bias driver, for all the bit lines in the memory array. The purpose of the global bias circuitry is to bias all deselected bit lines in the memory array to a potential which is close to the voltage of the selected local isolation bit line. In this manner, the two buried $N^+$ local bit lines laterally adjacent to one side of the selected cell are kept at the same voltage potential level. Moreover, because of the direct influence of the global bias circuitry, in this invention, the potential difference between the two adjacent buried $N^+$ local bit lines near the selected cell, as comparing to the situation wherein the deselected virtual ground bit lines are connected to ground (U.S. Pat. No. 5,132,933), is much smaller, and even is negligible. As a result, the leakage current of the adjacent "ON" cell is significantly reduced. Especially, in case the power noise exists, and the potential difference is induced between the bias voltage from the global bias circuitry and the bias voltage from the local bias driver, this potential difference, for example about 0.3 volt or even greater, will not significantly increase the potential difference between the two adjacent buried $N^+$ local bit lines near the selected cell. Therefore, the data access of the current detector to the selected cell is not affected.

According to this preferred embodiment, the global bias circuitry includes two parts:

(1) GLOBAL BIAS VOLTAGE GENERATOR: it is used to generate the third bias voltage, connected to the control gate of the static pull-up devices, for controlling and keeping the voltage of the deselected bit lines approximately at the level of the third bias voltage minus a threshold voltage, $V_{TH}$.

(2) STATIC PULL-UP NMOS TRANSISTORS: they are used as resistance elements, to keep the voltage of the deselected bit lines at the level equal to the difference of the third bias voltage and the threshold voltage $V_{TH}$. Also, they are used to compensate the leakage current of the deselected bit lines. For these purposes, the static pull-up NMOS devices are not necessary to be very strong; as long as they can compensate the leakage current of each bit line. Moreover, to the selected data sense bit line, the static pull-up devices must not be too strong, or the current of the selected "ON" cell will be offset. According to the preferred embodiment of the present invention, the strength of the static pull-up NMOS devices are about ½~1/10 of the strength of the memory cell, lest it affects the current detection and data accessing of the selected cell.

BRIEF DESCRIPTION OF THE DRAWINGS

The present invention can be more fully understood by reference to the following detailed description and accompanying drawings, which form the integral part of this application, and wherein.

DETAILED DESCRIPTION OF THE PREFERRED EMBODIMENTS OF THE INVENTION

Figure 1:
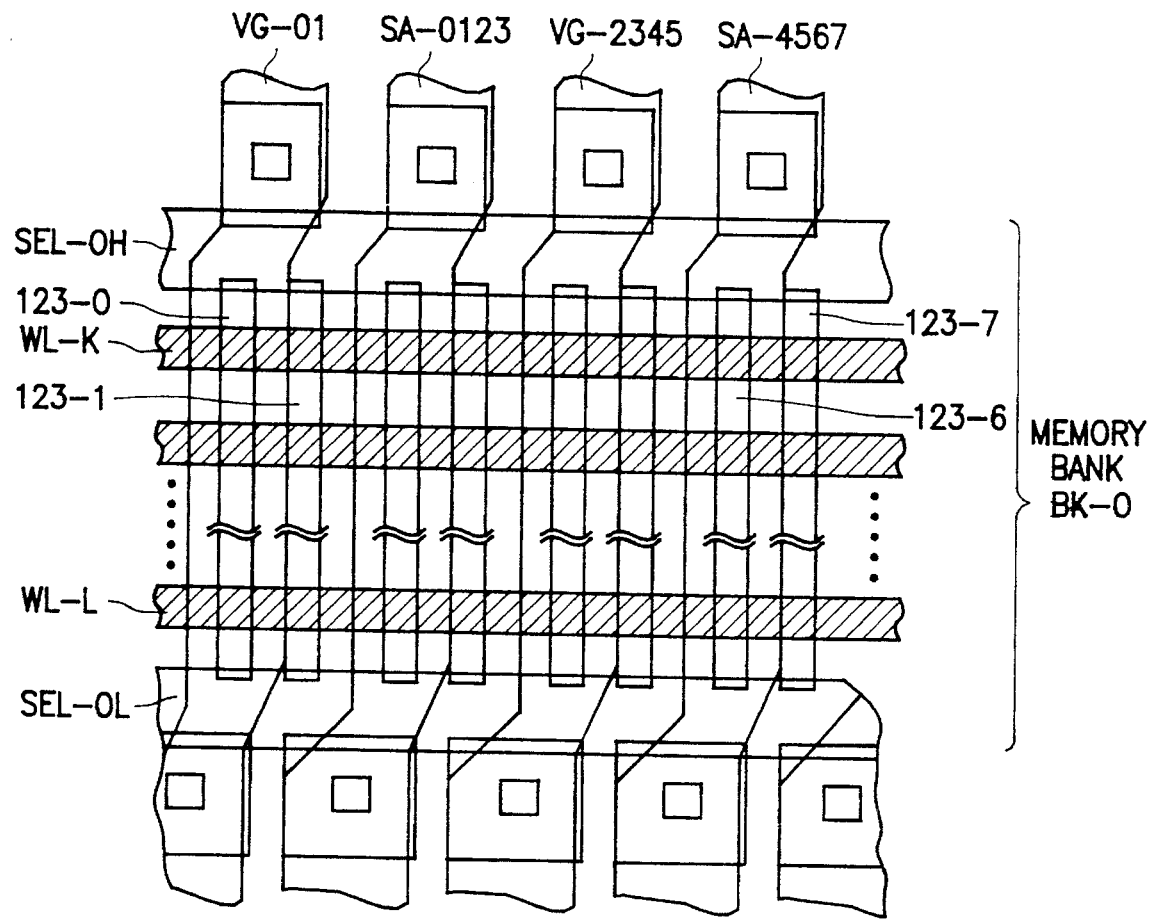
FIG. 1 is an IC (integrated circuit) layout diagram of a sub-array of a conventional flat-cell memory with bank selector.
Figure 2:
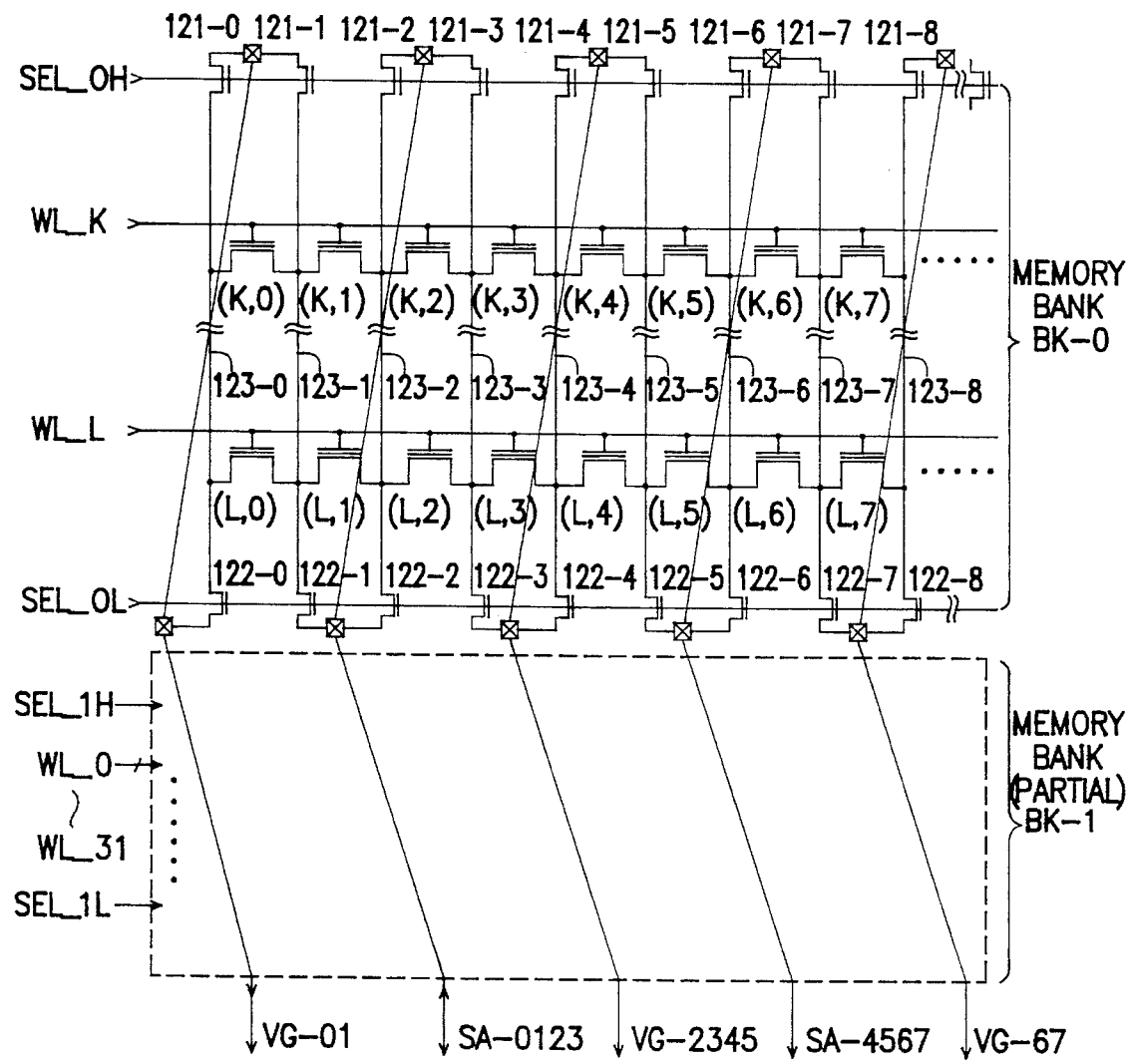
FIG. 2 is an equivalent circuit diagram of the IC layout of FIG. 1.
Figure 3:
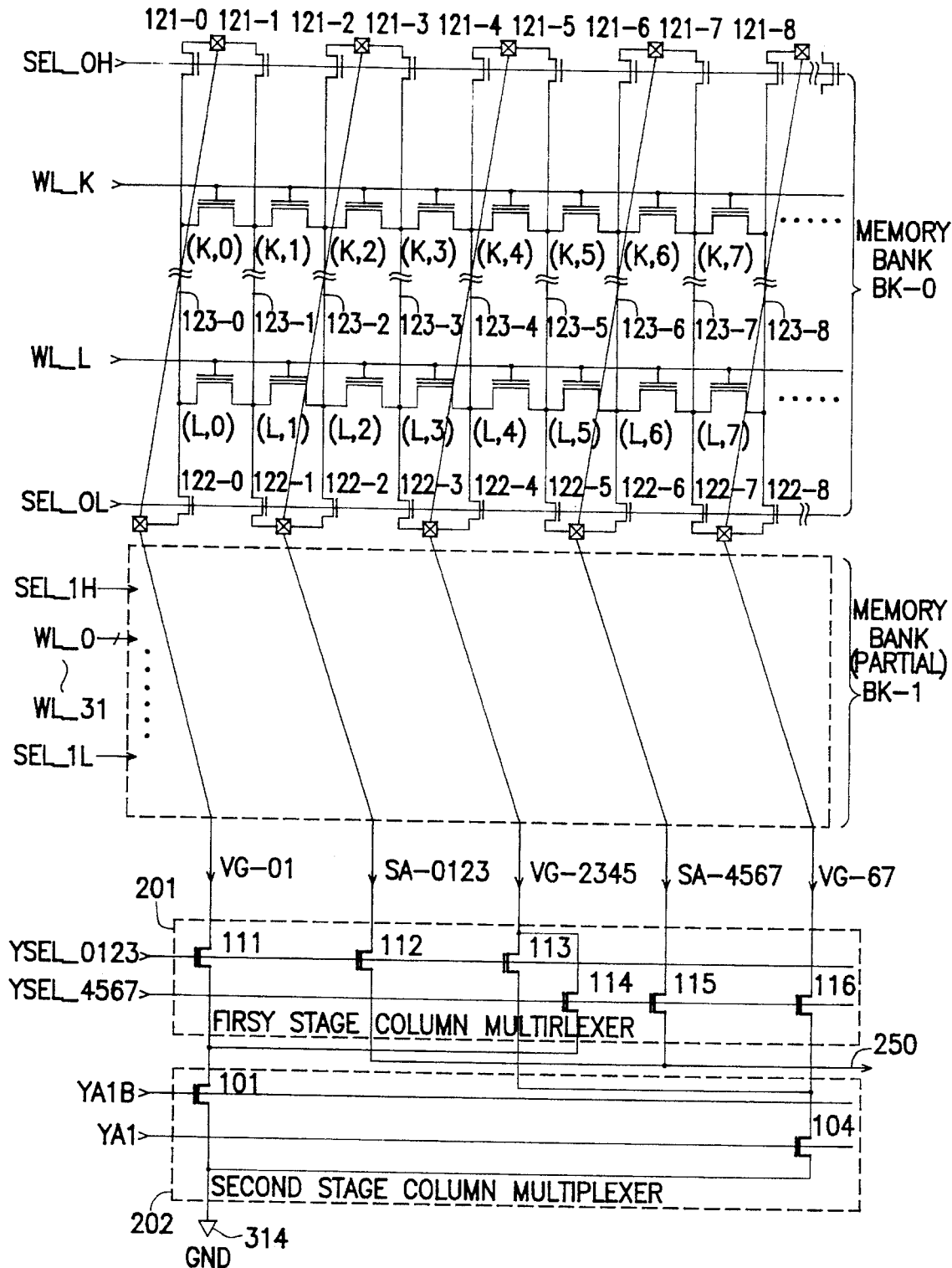
FIG. 3 is a schematic circuit diagram of the circuit, as shown in FIG. 2, connected with a conventional column multiplexer.
Figure 4:
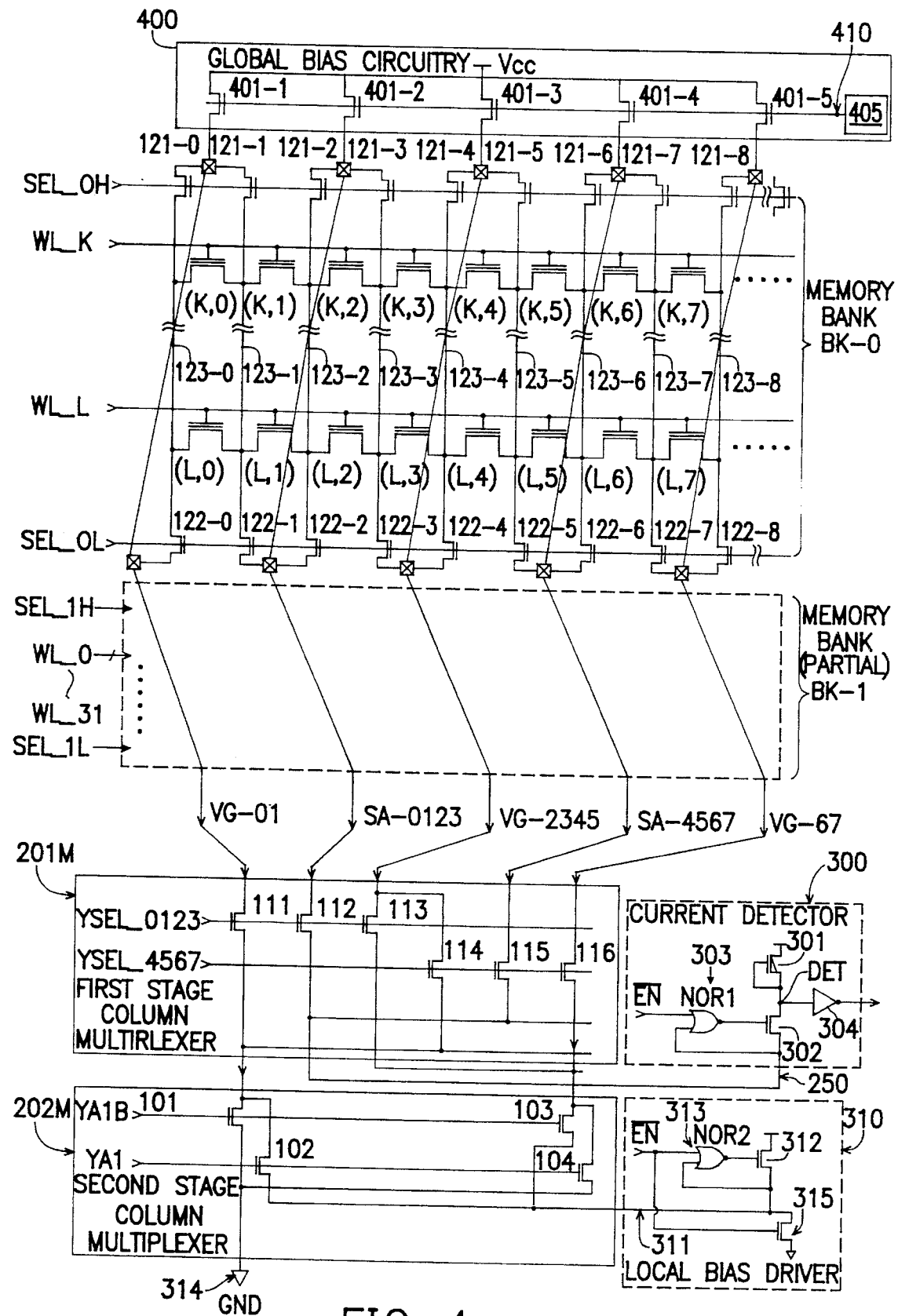
FIG. 4 is a schematic circuit diagram of the memory sub-array circuit, as shown in FIG. 2, connected with a bias circuit for a virtual ground non-volatile memory array with bank selector, according to one preferred embodiment of the present invention.

Referring now to FIG. 4, there is shown a bias circuit for a virtual ground non-volatile memory array with bank selector according to one preferred embodiment of the present invention. As shown in FIG. 4, the virtual ground non-volatile memory array with bank selector is the same as that shown in FIG. 2 or 3, and thus the same reference numbers are also used here. The main difference between the bias circuit of the present invention and the prior art is that the bias circuit of the present invention includes a global bias circuitry 400; a local bias circuitry 300, 310, and 314; and an improved column multiplexer 201M and 202M.

The local bias circuitry includes a current detector 300, a local bias driver 310, and a virtual ground reference voltage 314. The current detector 300 is mainly used to detect the current of the selected cell, and to provide a bias point for the selected data sense bit line, so that the voltage of the selected data sense bit line swings only within a small range around the bias voltage, depending on whether the selected cell is an "ON" cell or an "OFF" cell, when the memory device is sensed. In this manner, the voltage variation of the selected data sense bit line is minimized to speed up the current detection. The local bias driver 310 provides another bias voltage on line 311 to the deselected virtual ground bit line which is adjacent to the selected data sense bit line (in this invention, it is called "the selected local isolation bit line"), in order to minimize the potential difference between the selected data sense bit line and the adjacent selected local isolation bit line. Even there is a voltage drop at the bank selector, the potential difference between the two buried $N^+$ local bit lines, all adjacent to one side of the selected cell to which the selected local isolation bit line is also adjacent, is also negligible, so that the access time, sensing accuracy, and the sensing margin are not affected. Additionally, the local bias circuitry also provides a virtual ground reference node 314, which may be a ground node GND, to allow the selected virtual ground bit line to connect to ground so as to form a signal path from the power source $V_{CC}$ to ground GND for the selected cell.

According to one preferred embodiment of the present invention, the current detector 300 includes:

(1) A LOAD (or RESISTANCE) DEVICE 301: preferably embodied as a PMOS transistor, as shown in FIG. 4. The load device 301 converts the current through the current detector 300 into a voltage signal so that the next-stage comparator or inverter 304 can convert this voltage signal to a logic signal which is used to determine the state of the stored data in the selected cell. If the selected cell is an "ON" cell, a relatively large current flows through the load device 301, and causes a relatively large potential drop at node "DET", so that the potential level at node "DET" is lower than the "trip voltage" of the next-stage inverter 304 and thus causes the output of the inverter 304 to assume a logic "1" or high state. On the other hand, if the selected cell is an "OFF" cell, a relatively small current flows through the load 301. The potential level at node "DET" is then higher than the "trip voltage" of the next-stage inverter 304, and thus causes the output of the inverter 304 to assume a logic "0" or low state. Assume there is no interference of leakage o current from adjacent "ON" cell, it is defined in this specification that $I_{CELL}$ is the current flowing through a selected and completely turned-on "ON" cell. If the selected cell is an "OFF" cell, the current therethrough is nearly zero because the threshold voltage $V_{TH}$ of the selected cell is greater than the power source $V_{CC}$ (i.e. the voltage of the selected word line). As so defined, the trip voltage of the inverter 304 is set at the voltage value presented at the node "DET" when ½ $I_{CELL}$ flows through the load device 301. The main reason of such a setting is the current detector 300 can achieve maximal sensing margin both for the "ON" cell and "OFF" cell. In other words, error in data sensing will not be caused in the following situations: the "ON" or "OFF" cell is interfered by the leakage current from the neighboring "ON" cell; the turned-on currents of the "ON" cells are non-uniform due to process non-uniformity; the "OFF" cell has leakage current (i.e. not completely off); and even the pre-set trip voltage of the inverter 304 is drifted off due to the process variation. However, taking the leakage current of neighboring "ON" cell into consideration, an adequate bias technique is needed, or a large leakage current from neighboring "ON" cell will be generated and interfere the current of the selected cell, resulting in that the sensing margin of the current detector 300 is reduced.

(2) A CURRENT SWITCHING DEVICE 302: preferably an NMOS transistor having its drain connected to the load device 301, its gate connected to the output of an inverting amplifier 303, and its source connected to a data line 250. The size of the current switching device 302 and the amplification rate of the inverting amplifier 303 are the factors to determine the voltage difference of the data line 250 in cases of the selected "ON" cell and the selected "OFF" cell. More specifically, when the selected cell is an "ON" cell, there is a relatively larger current flowing from the load device 301 through the current switching device 302, to the data line 250, and then to the memory array. In this case, the gate-to-source voltage $V_{GS}$ of the current switching device 302 has to be relatively larger to enable a lager current to flow through the current switching device 302. In order to obtain a larger $V_{GS}$, the current of the memory cell will discharge the charges in the bit lines to drop the potential level at the data line 250. At the same time, the output voltage of the inverting amplifier 303 will rise due to the amplification effect of the inverter amplifier 303, so that the $V_{GS}$ of the current switching device 302 is increased. On the other hand, when the selected cell is an "OFF" cell, the current flowing through the memory cell is small, or even zero. In this case, the current from the load device 301 is greater than the current of the selected cell, and therefore the voltage of the bit lines is charged up. Through the effect of the inverting amplifier 303, the voltage $V_{GS}$ of the current switching device 302 will drop to a level allowing only a small current or even zero current through the "OFF" memory cell.

The voltage variation of the data line 250 in cases of the "OFF" and "ON" cells depends on the $I_{CELL}$, the size of the current switching device 302, and the gain of the inverting amplifier 303. The larger the $I_{CELL}$, the greater is the potential difference of the data line 250 in cases of the selected "ON" and "OFF" cells. When $I_{CELL}$ is fixed, the larger the size of the current switching device 302, the smaller is the potential difference of the data line 250. When $I_{CELL}$ is fixed, increasing the gain of the inverting amplifier results in a smaller the potential difference. The larger the potential difference, the longer the access time in the case that the selected cell is changed from an "ON" cell to an "OFF" cell and vice versa. The reason is that more bit line charges must be discharged by the "ON" cell current, or charged up by the current of the load device 301. The larger the potential difference, the better the noise margin, and, as a result, the more stable is the current detection. More specifically, in the case that the selected cell is to be changed from an "ON" cell to an "OFF" cell, the data line 250 is at lower potential and the current through the load device 301 is equal to $I_{CELL}$, at the beginning of the cell changing. After the selected cell is changed to the "OFF" cell, the current of the selected cell in the memory array goes low, and the current of the load device 301 charges up the capacitors inherent in the data line 250 and the bit lines; the potential of the bit lines is raised; consequently, the voltage $V_{GS}$ of the current switching device 302 becomes small, and the current of the load device 301 is decreased. When the current of the load device 301 is approximately equal to ½ $I_{CELL}$, the output of the next-stage inverter 304 changes from "1" to "0"; then the correct data is detected. On the other hand, in the case that the selected cell is to be changed from an "OFF" cell to an "ON" cell, the data line 250 is at higher potential and the current through the current switching device 302 is almost cut off, at the beginning of the cell changing. That is to say, the current through the current switching device 302 is approximately equal to the "OFF" cell current. When the "ON" cell is slowly activated, the current of the selected cell becomes large, and the data line 250 and the bit lines are discharged to a lower potential. The current switching device 302 changes status from approximately turned-off to completely turned-on, and the current of the load device 301 increases. When the current of the load device 301 is approximately equal to ½ $I_{CELL}$, the output of the next-stage inverter 304 changes status from "0" to "1", and then the correct data is detected.

If the flat-cell memory array with bank selector is not properly biased, it suffers a great deal of leakage current in the adjacent "ON" cell. Then the current flowing from the adjacent "ON" cell to the selected "ON" cell causes a reduction of the selected "ON" cell current which is used to discharge the bit lines; this slows down the discharging speed of the data line 250 and lengthens the data sensing time when the selected cell switches from an "OFF" cell to an "ON" cell. Additionally, the leakage current from the adjacent "ON" cell to neighboring "ON" cells will reduce the portion of the current of the load device 301 which is used to charge up the bit line and data line 250. This leads to a slowdown in charging up the data line and lengthens the data sensing time when the selected cell switches from an "ON" cell to an "OFF" cell.

In order to obtain the better data line potential difference between the selected "ON" cell and "OFF" cell, according to the preferred embodiment of this invention, the gain of inverting amplifier 303 may be set in the range of about 7~20, and preferably about 10. As for the value of $I_{CELL}$, it depends on the process and the design rules employed in laying out the memory device; normally it is set at about 40~100 µA. For the current switching device 302, the width/length ratio may be set at about 6~10.

(3) AN INVERTING AMPLIFIER 303: Its gain is used to amplify the tiny voltage variation in the data line 250. This amplified voltage is used to adjust the gate-to-source voltage $V_{GS}$ of the current switching device 302. Also, the trip voltage $V_{trip1}$ of the inverting amplifier 303 is used to clap the voltage of the data line 250 approximately at the $V_{trip1}$. When there is no current flowing through the current switching device 302, the inverting amplifier 303 claps the data line at $V_{DL}=V_{trip1}-[V_{TH}/(A_{v1}+1)]$, wherein $V_{TH}$ is the threshold voltage of the current switching device 302 and is about 1 Volt, $A_{v1}$ is the gain of the inverting amplifier 303, and $V_{trip1}$ is the trip voltage of the inverting amplifier 303 (i.e. Vin=$V_{out}$=$V_{trip1}$). To the current detector which needs the power down control, a NOR gate may be used for the inverting amplifier 303 (as shown in FIG. 4), and its trip voltage $V_{trip1}$ depends on the size of its internal PMOS and NMOS transistors. According to this embodiment, the $V_{trip1}$ may be set in the range of about 1.3~1.7 Volt, and preferably about 1.5 Volt.

According to one preferred embodiment of the present invention, the local bias driver 310 comprises:

(1) A CURRENT SWITCHING DEVICE 312: The purpose of the local bias driver 310 is to bias the selected local isolation bit line at near the voltage potential of the selected data sense bit line so as to reduce the leakage current of the "ON" cell adjacent to the selected cell. When the selected local isolation bit line is the previously selected virtual ground bit line, the local bias driver 310 must rapidly charge up this bit line to the voltage near the selected data sense bit line. Therefore, the current switching device 312 of the local bias driver 310 must be strong enough; that is to say, the size of the NMOS transistor 312 must be large enough. According to this embodiment, the width/length ratio of the current switching device 312 is about 20~30.

(2) AN INVERTING AMPLIFIER 313: One input terminal of the inverting amplifier 313 is connected to the intersection of the local bias driver 310 and the improved column multiplexer 202M, which is called an isolation line 311 in this specification; and the output terminal of the inverting amplifier 313 is connected to the gate of the current switching device 312. The structure of the MOSFET transistors in this inverting amplifier 313 is similar to the one in the inverting amplifier 303 of the current detector 300, but the sizes of the transistors have a little difference, whereby the trip voltage $V_{trip2}$ of the inverting amplifier 313 is adjusted to be a little bit lower than the trip voltage $V_{trip1}$ of the inverting amplifier 303. Based on the sizes of the memory cell and the bank selector, and the trip voltage $V_{trip1}$ of the inverting amplifier 303, the trip voltage $V_{trip2}$ of the inverting amplifier 313 is adequately adjusted to make all the currents through the "ON" cells adjacent to the selected cell about equal no matter what kind of the selected cell is, i.e. "ON" cell or "OFF" cell. These currents are preferably a little less than 1/10 $I_{CELL}$ so as to obtain the optimal sensing margin of the current detector and to expedite the sensing speed. According to one preferred embodiment of the present invention, based on the 1.0 µm process, if the size of the memory cell is bout 0.8 µm wide and 0.8 µm long; the trip voltage $V_{trip1}$ of the inverting amplifier 303 is about 1.3~1.7 Volt, and preferably about 1.5 Volt; and the trip voltage $V_{trip2}$ of the inverting amplifier 313 is adjusted to be about several tens of millivolts lower than the $V_{trip1}$. Because the layouts of the current detector 300 and the local bias driver 310 are similar, so are the inverting amplifiers 303 and 313, the process tracking can be achieved.

(3) A VIRTUAL GROUND REFERENCE VOLTAGE NODE 314: It provides a grounding path for the selected cell. This virtual ground reference voltage node 314 is usually a real ground GND, and is connected to the output of the second stage of the improved column multiplexer.

Besides the above three elements, the local bias driver 310 may include a bleed device 315 which supplies a discharge path for the trapped electric charges on the virtual ground bit lines due to the power noise, lest the voltage of the selected local isolation bit line is too high and there is no any discharge path, resulting in a large current leakage into the "ON" cell adjacent to the selected cell, and thus a damage to the local bias effect. According to one preferred embodiment of the present invention, the strength or size of the bleed device 315 is about 2~5 times that of the memory cell.

According to one preferred embodiment of the present invention, the first stage 201M of the improved column multiplexer is similar to the one shown in FIG. 3; but the second stage 202M of the column multiplexer is different from the one shown in FIG. 3. The difference occurs due to the additional transfer gates 102 and 103 that are used to provide the connection link between the selected local isolation bit line and the local bias driver 310. The column multiplexer of this invention is used to select one of the two virtual ground bit lines respectively adjacent to the two sides of the selected data sense bit line to be the selected virtual ground bit line, and the other to be the selected local isolation bit line. The second-stage column multiplexer 202M is connected to the local bias driver 310 via the isolation line 311.

According to one preferred embodiment of the present invention, the global bias circuitry 400 is used to provide a bias voltage to all bit lines of the memory array. This bias voltage is approximate to the bias voltage supplied by the local bias driver 310. The global bias circuitry 400 includes a static pull-up current source which is used to compensate the leakage currents of the bit lines that may come from the P-N junction leakage. The purpose of the global bias circuitry 400 is to bias all the deselected bit lines at the potential level approximately equal to the voltage of the selected local isolation bit line. In this manner, the voltages of any two adjacent bit lines, no matter how far away they are from the selected cell, are maintained at the same potential level. In other words, any two adjacent buried $N^+$ local bit lines, which are located a relatively long distance away from the selected cell, are still maintained at the same voltage level. Furthermore, under the influence of this bias voltage of the global bias circuitry 400, the bit lines near the selected cell are also maintained at the same voltage level, so that the potential difference is minimized between any two adjacent buried $N^+$ local bit lines which are near to the selected cell and located at the same side as the selected local isolation bit line. Therefore, large leakage current in the adjacent "ON" cell can be avoided.

The global bias circuitry 400 includes static pull-up NMOS transistors 401-1, 401-2, . . . ,401-5 . . . ; and a global bias voltage generator 405. The static pull-up NMOS transistors 401-1–401-5 have their gates connected to an output terminal 410 of the voltage generator 405, have their drains connected to the positive power source $V_{CC}$, and have their sources connected to the bit lines. The global bias voltage generator 405 generates a bias voltage Vbias3 at its output terminal 410. The static pull-up NMOS transistors of the global bias circuitry 400 are very weak, and are used only to bias the deselected bit lines at the potential level near the voltage of the selected local isolation bit line. If the static pull-up NMOS transistors are too strong, and the bias voltage Vbias3 is improperly higher than the desired voltage level, the static pull-up NMOS transistor which is connected to the selected data sense bit line has a pull-up force which will pull up the voltage of the selected data sense bit line to a level higher than the clamping voltage of the inverting amplifier 303 in the current detector 300. To the selected "ON" cell, this will lead to error sensing. Thus, the static pull-up NMOS transistors are usually weaker than the memory cell in strength. According to one preferred embodiment of the present invention, the strength or size of the static pull-up NMOS transistors is about ½–1/10 of that of the memory cell. In another method, the bias voltage supplied by the static pull-up NMOS transistors is set at about 0.1–0.2 Volt lower than the voltage of the selected local isolation bit line in order to resolve the problem in pull-down of the voltage of the selected data sense bit line and in order not to improperly increase the leakage current of the adjacent "ON" cell. In yet another method, weaker static pull-up NMOS transistors, e.g. with strength about 1/5–1/10 of the memory cell, are connected to the data sense bit lines, and stronger static pull-up NMOS transistors, e.g. with strength about ½–⅓ of the memory cell, are connected to the virtual ground bit lines.

The global bias voltage generator 405 is used to generate the bias voltage Vbias3 at its output terminal 410 which is supplied to the gate of each of the static pull-up NMOS transistors. The bias voltage Vbias3 is made approximately equal to the voltage of the local isolation bit line plus the threshold voltage $V_{TH}$ of the static pull-up NMOS transistors so as to enable the static pull-up NMOS transistors to provide the bit lines with a global bias voltage approximately equal to the voltage of the selected local isolation bit line.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed is:

1. A bias circuit for a virtual ground non-volatile memory array with bank selector, wherein said memory array includes a plurality of banks, each bank including a memory sub-array consisting of a plurality of columns and rows of memory cells, a plurality of bank selectors, and a plurality of alternately arranged data sense bit lines and virtual ground bit lines connected between said bank selectors, said bias circuit comprising:

a global bias circuitry connected to all of said data sense bit lines and said virtual ground bit lines for providing a first predetermined bias voltage to all said data sense bit lines and said virtual ground bit lines:

a local bias circuitry; and a column multiplexer connected between said banks and said local bias circuitry, said column multiplexer, according to the memory cell selected to be accessed, selecting a corresponding data sense bit line as a selected data sense bit line, and selecting one of two of said virtual ground bit lines which are respectively adjacent to two sides of said selected data sense bit line as a selected virtual ground bit line, and the other as a selected local isolation bit line, and then said column multiplexer connecting said selected data sense bit line, said selected virtual ground bit line and said selected local isolation bit line to said local bias circuitry, and isolating the rest of said data sense bit lines and virtual ground bit lines from said local bias circuitry;

wherein said local bias circuitry provides a second predetermined bias voltage to said selected data sense bit line, a third predetermined bias voltage to said selected local isolation bit line, and a reference voltage to said selected virtual ground bit line.

2. The bias circuit as claimed in claim 1, wherein said local bias circuitry comprises:

a current detector connected to said selected data sense bit line via said column multiplexer for supplying said second predetermined bias voltage to said selected data sense bit line, and for detecting the current through said selected data sense bit line;

a local bias driver connected to said selected local isolation bit line via said column multiplexer for supplying said third predetermined bias voltage to said selected local isolation bit line; and a virtual ground reference voltage node connected to said selected virtual ground bit line via said column multiplexer for supplying said reference voltage to said selected virtual ground bit line.

3. The bias circuit as claimed in claim 2, wherein said current detector comprises:

a load device used to convert a current signal on said data sense bit line into a voltage signal;

a comparator connected to said load device for converting said voltage signal into a logic signal representing said selected memory cell's stored data;

a current switching device connected to said load device; and an inverting amplifier connected to said current switching device, said inverting amplifier operating with said current switching device to switch said current signal on said selected data sense bit line and to bias said selected data sense bit line at said second predetermined bias voltage.

4. The bias circuit as claimed in claim 3, wherein said load device is a PMOS transistor; said comparator is an inverter; said current switching device is an NMOS transistor; and said inverting amplifier is a NOR gate.

5. The bias circuit as claimed in claim 4, wherein said inverting amplifier has a gain of about 7~20, a trip voltage of about 1.3~1.7 Volt; said selected memory cell has an "ON" state current about 40~100 µA if it is programmed as an "ON" cell; and said current switching device has a width/length ratio of about 6~10.

6. The bias circuit as claimed in claim 5, wherein said inverting amplifier preferably has a gain of about 10, and a trip voltage of about 1.5 Volt.

7. The bias circuit as claimed in claim 2, wherein said local bias driver comprises a current switching device and an inverting amplifier connected to each other for switching the current on said selected local isolation bit line, and for biasing said selected local isolation bit line at said third predetermined bias voltage.

8. The bias circuit as claimed in claim 7, wherein said current switching device is an NMOS transistor and said inverting amplifier is a NOR gate.

9. The bias circuit as claimed in claim 7, wherein said third predetermined bias voltage is about several tens of millivolts lower than said second predetermined bias voltage.

10. The bias circuit as claimed in claim 7, wherein said local bias driver further comprises a bleed device connected to said local isolation bit line via said column multiplexer for providing a discharging path to electric charges trapped in said local isolation bit line due to power noise.

11. The bias circuit as claimed in claim 10, wherein said bleed device has a strength about 2~5 times of the strength of the memory cells.

12. The bias circuit as claimed in claim 8, wherein said current switching device has a width/length ratio of about 20~30.

13. The bias circuit as claimed in claim 2, wherein said virtual ground reference voltage node is a ground.

14. The bias circuit as claimed in claim 2, wherein said column multiplexer includes a first-stage column multiplexer and a second-stage column multiplexer formed by a plurality of transfer gates, and wherein said first-stage column multiplexer selects said selected data sense bit line to be connected to said current detector, while said second-stage column multiplexer selects said selected local isolation bit line to be connected to said local bias driver, and selects said selected virtual ground bit lines to be connected to said virtual ground reference voltage node.

15. The bias circuit as claimed in claim 1, wherein said global bias circuitry comprises:

a global bias voltage generator for generating a global bias voltage; and a plurality of static pull-up transistors having gates connected to said global bias voltage, drains connected to a power source, and sources connected to all of said data sense bit lines and virtual ground bit lines, respectively.

16. The bias circuit as claimed in claim 15, wherein said first predetermined bias voltage approximately equals said third predetermined bias voltage.

17. The bias circuit as claimed in claim 16, wherein each of said static pull-up transistors is an NMOS transistor with a strength about ½~1/10 of the strength of said memory cells.

18. The bias circuit as claimed in claim 16, wherein each of said static pull-up transistors is an NMOS transistor, and said static pull-up transistors, which are connected to said data sense bit lines, have a strength about 1/5~1/10 of the strength of said memory cells, while said static pull-up transistors, which are connected to said virtual ground bit lines, have a strength about ½~1/3 of the strength of said memory cells.

19. The bias circuit as claimed in claim 16, wherein said first predetermined bias voltage is about 0.1~0.2 Volt lower than said third predetermined bias voltage.

* * * * *